United States Patent [19]
Crawford et al.

[11] Patent Number: 4,758,774
[45] Date of Patent: Jul. 19, 1988

[54] PORTABLE TESTER AND RELATED METHOD FOR DETERMINING THE PRIMARY WINDING TO SECONDARY WINDING CURRENT RATIO OF AN IN-SERVICE CURRENT TRANSFORMER

[75] Inventors: Tullus E. Crawford; Claude R. Riley, Jr., both of Knoxville, Tenn.

[73] Assignee: Special Instruments Laboratory, Incorporated, Knoxville, Tenn.

[21] Appl. No.: 728,194

[22] Filed: Apr. 29, 1985

[51] Int. Cl.$^4$ .............................................. G01R 31/02
[52] U.S. Cl. ................................. 324/55; 324/140 D; 324/142
[58] Field of Search .......... 324/51, 55, 117 R, 140 R, 324/140 D, 127, 74, 142, 99 D; 323/357, 358; 307/358

[56] References Cited

U.S. PATENT DOCUMENTS

| | | | |
|---|---|---|---|
| 2,362,372 | 11/1944 | Halfmann | 324/127 |
| 2,527,568 | 10/1950 | Murray | 324/55 |
| 2,657,356 | 10/1953 | Mulavey | 324/55 |
| 2,910,646 | 10/1959 | Schutzner | 324/55 |
| 2,921,255 | 1/1960 | Norton | 324/55 |
| 3,958,178 | 5/1976 | Mueller et al. | 324/99 D X |
| 4,241,306 | 12/1980 | Bump | 324/55 |
| 4,439,724 | 3/1984 | Morong, III | 324/55 |
| 4,490,671 | 12/1984 | Morong, III | 324/55 |

FOREIGN PATENT DOCUMENTS 2539271 3/1977 Fed. Rep. of Germany ........ 324/55
2019015A 10/1979 United Kingdom .................. 324/55

OTHER PUBLICATIONS

Dranetz Model 325 Electronic Solid-State Portable Digital Power-System Polymeter, 2-1981, pp. 1-8.

*Primary Examiner*—Reinhard J. Eisenzopf
*Assistant Examiner*—Jack B. Harvey
*Attorney, Agent, or Firm*—Finnegan, Henderson, Farabow, Garrett & Dunner

[57] ABSTRACT

A portable tester for determining the primary winding to secondary winding current ratio of a current transformer while that transformer is in service, including a current probe having a split core positionable around an active power line supplying current to the transformer, an AC to DC converter to convert the AC output of that probe to a first DC signal, another AC to DC converter for converting the secondary output of the current transformer under test to a second DC signal, and a ratio meter for converting the first and second DC signal into a visual display of the ratio of those signals. A mechanism is provided for assuring proper location of the decimal point on the ratio meter. Polarity and burden testing is also provided.

12 Claims, 2 Drawing Sheets

PORTABLE TESTER AND RELATED METHOD FOR DETERMINING THE PRIMARY WINDING TO SECONDARY WINDING CURRENT RATIO OF AN IN-SERVICE CURRENT TRANSFORMER

BACKGROUND OF THE INVENTION

I. Field of the Invention

The present invention relates to a portable apparatus for readily and easily measuring the primary winding to secondary winding current ratio of a current transformer while that transformer is in service.

II. Background Information

Large current transformers, capable of receiving primary current loads on the order of 200 to 12,000 amperes are well known. Such current transformers typically (when utilized at a rating factor of one) have a primary to secondary current ratio from 200:5 to 400:5 for current transformers capable of handling primary currents on the order of 200 to 400 amperes; from 400:5 to 800:5 for current transformers capable of handling primary currents on the order of 400 to 800 amperes; from 1200:5 to 2000:5 for current transformers capable of handling primary currents on the order of 800 to 2,000 amperes; and from 3000:5 to 12,000:5 for current transformers capable of handling primary currents on the order of 2,000 to 12,000 amperes.

Primary to secondary winding ratios ideally reflect expected primary to secondary current ratios when such current transformers are in actual operation. However, current transformers of this magnitude are not linear, that is to say, the current ratio of primary current to secondary current may very well change as a function of the primary current itself. Accordingly, it is the actual primary current to secondary current ratio under load conditions which must be accurately measured to determine the operational characteristics of such transformers.

Primary current to secondary current ratio measurement is presently very difficult to obtain. Using known techniques, such measurement must occur while the transformer is out of service, that is, while the primary winding of the transformer is disconnected from any unregulated current supply. In this condition, a known source current can be applied to the current transformer and the resultant secondary current measured. A ratio between the known source current and measured secondary current can then be mathematically calculated to determine the primary to secondary current ratio. Of course, large well-regulated current sources are required to utilize this method of obtaining primary current to secondary current ratios for large current transformers.

In the alternative, an unknown current may be applied to the primary windings and an attempt may be made by two persons simultaneously to read both the primary current and the secondary current using current probes and hand-held meters. At a given instant of time, simultaneous readings are taken and the ratio between these two readings manually calculated. Obviously, such prior art methodology is cumbersome and inaccurate.

It is, accordingly, an object of the present invention to provide a portable tester which is capable of automatically, efficiently, and accurately determining the primary to secondary winding current ratio of a current transformer without the necessity of removing that transformer from active service.

In other words, it is an object of the subject invention to obtain simultaneous acquisition and display of primary and secondary currents of an in-service current transformer and automatically calculate and display the ratio of those currents.

Additional objects and advantages of the invention will be set forth in the description which follows and in part will be obvious from the description or may be learned by practice of the invention.

SUMMARY OF THE INVENTION

To achieve the foregoing objects and in accordance with the purposes of the invention as embodied and broadly described herein, a portable tester is provided for determining the primary winding to secondary winding current ratio of a current transformer while that transformer is in service with the primary winding coupled to an active power line carrying a first AC signal and with the secondary winding coupled to a load to deliver a second AC signal to that load, the portable tester comprising: (a) a current probe having a split core positionable around the active power line to provide a third AC signal which is proportional in magnitude to the magnitude of the first AC signal; (b) a circuit for deriving a first DC signal having a magnitude proportional to the magnitude of the third AC signal; (c) a circuit for deriving a second DC signal having a magnitude proportional to the magnitude of the second AC signal; and (d) electronic means for converting the first and second DC signals into a visual display of the ratio of the first and second DC signals, the electronic means including a DC signal ratio meter and means for simultaneously applying the first and second DC signals to the meter to display the ratio on the meter.

Preferably, the tester of the subject invention further includes means for selectively displaying on the signal ratio meter either the ratio of the first and second DC signals or the magnitude of the first DC signal, comprising a ratio switch which selectively couples either a reference voltage or a second DC voltage as one input to the signal ratio meter with the other input being the first DC voltage. It is also preferable that a second meter be provided which receives and displays the second DC signal.

It is still further preferable that the portable tester of the subject invention further include means for determining, upon proper orientation of the probe, whether the current transformer is connected to the power and to the load line with the correct polarity, this means for determining including a polarity switch connected to selectively deliver the third AC signal to the input of the circuit for deriving a second DC signal so that upon operation of the polarity switch the resultant display on the signal ratio meter will increase if the polarity is correct and decrease if the polarity is incorrect.

There is further provided means for providing a decimal point signal to a decimal point signal input of the signal ratio meter in response to the range of the first AC signal and/or operation of the ratio switch.

To achieve the foregoing objects, the subject invention may also be viewed as a method for testing the primary to secondary current ratio of a current transformer while that current transformer is operated under actual load conditions, with this method comprising the steps of: (a) positioning a current probe having a split core around a conductor carrying primary current to the current transformer, without disconnection of the conductor from the current transformer, to obtain a first AC signal from the coil which is porportional to the primary current; (b) converting that first AC signal to a first DC signal; (c) inserting a test load in series with the normal load connected to the secondary of the current transformer to develop a second AC signal across the test load which is proportional to the secondary current in the current transformer; (d) converting that second AC signal to a second DC signal; and (e) simultaneously applying the first and second DC signals to a signal ratio meter to display the simultaneous ratio of the first and second DC signals while the current transformer is operated under actual load conditions.

BRIEF DESCRIPTION OF THE DRAWINGS

The accompanying drawings, which are incorporated in and constitute a part of the specification, illustrate a preferred embodiment of the invention and, together with the general description of the invention given above and a detailed description of the preferred embodiment given below, serve to explain the principles of the invention.

DESCRIPTION OF THE PREFERRED EMBODIMENT

Reference will now be made in detail to the present preferred embodiment of the invention as illustrated in the accompanying drawings.

Figure 1:
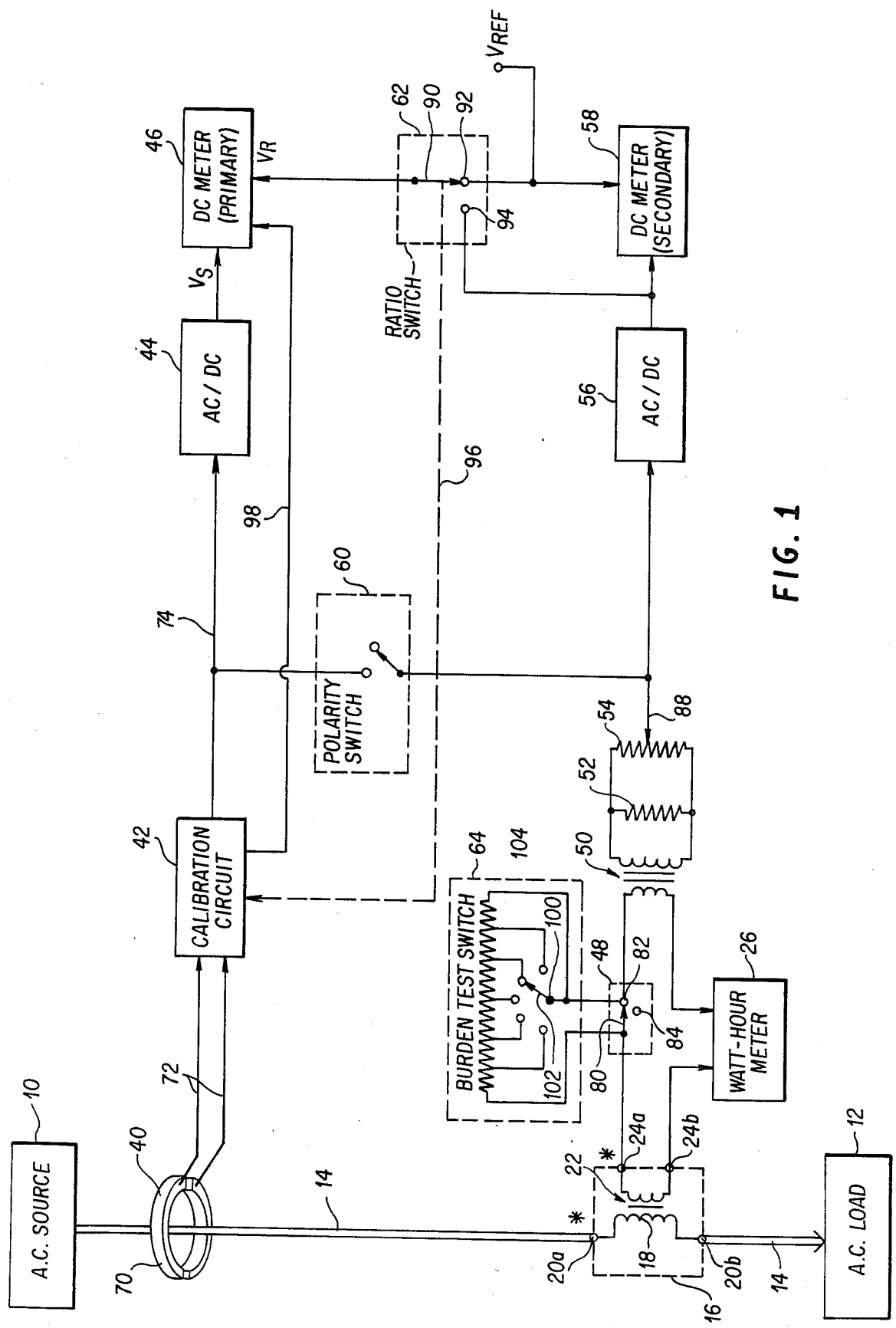
FIG. 1 is a block diagram of a portable tester incorporating the teachings of the subject invention.

In FIG. 1 a source of AC current 10 is shown connected to an AC load 12 by a conductor 14. A current transformer 16 is shown connected in series with conductor 14 between AC source 10 and AC load 12.

As illustrated in FIG. 1, current transformer 16 comprises a primary winding 18, primary winding terminals 20a and 20b, secondary winding 22, and secondary winding terminals 24a and 24b.

Watt-hour meter 26 is further shown in FIG. 1. Under normal operating conditions, watt-hour meter 26 would be coupled directly to secondary winding terminals 24a and 24b. Accordingly, a secondary current developed in the secondary winding of current transformer 16 would provide a signal to watt-hour meter 26 indicating the amount of primary current passing through conductor 14 and primary winding 18 for any given period of time.

Obviously, it is important that the primary current to secondary current ratio of current transformer 16 be accurately known in order to properly calibrate watt-hour meter 26. It is, accordingly, a primary object of the subject invention to provide a portable tester which is capable of accurately and quickly measuring this ratio.

As shown in the embodiment of FIG. 1, a portable tester incorporating the teachings of the subject invention is illustrated as including a current probe 40, calibration circuit 42, AC to DC converter 44, DC meter 46, switch 48, transformer 50, resistor 52, variable resistor 54, AC to DC converter 56, DC meter 58, polarity switch 60, ratio switch 62 and burden test circuit 64. The totality of these parts, which comprise a portable tester built in accordance with the teachings of the subject invention, may be housed in a single, lightweight portable cabinet which permits these elements to be readily moved to the field location of current transformer 16.

Current probe 40, as illustrated in FIG. 1 is of a split core variety. That is to say, current probe 40 may be readily positioned around conductor 14 without any disassembling of conductor 14 from AC source 10 or from current transformer 16. Although illustrated in FIG. 1 as being positioned between AC source 10 and current transformer 16, current probe 40 may also be positioned around that portion of conductor 14 which extends from current transformer 16 to AC load 12. As shown in FIG. 1 current probe 40 has an arrow 70 or other suitable notation which provides a means for orienting current probe 40 relative to AC source 10. As shown in FIG. 1, current probe 40 is oriented so that arrow 70 points toward AC source 10 and away from AC load 12.

As should be readily understood to those skilled in the art, current probe 40 includes a coil (not shown) wrapped around the split core of current probe 40. An output from the coil of current probe 40 is connected over lines 72 to the input of calibration circuit 42. A preferred embodiment of calibration circuit 42 will be described below in connection with FIG. 2. Basically, calibration circuit 42 operates to provide an output AC signal to the input of AC to DC converter 44 which is within the operational range of AC to DC converter 44 and DC meter 46. The output of calibration circuit 42 is, as shown in FIG. 1, delivered to the input of AC to DC converter 44 over line 74.

AC to DC converter 44 is preferably a precise RMS-DC converter, although consistent with the general principles of the subject invention, any form of AC to DC converter may be utilized provided the output DC signal is sufficiently smooth to accurately operate DC meter 46 in the manner described below.

The output of AC to DC converter 44 is coupled to the input of DC meter 46. DC meter 46 is preferably a 4 and ½ digit LCD digital signal ratio meter, although an LED or other voltage registering meter may be employed.

Switch 48, as illustrated in FIG. 1, includes a swing arm 80 which is capable of being connected to terminal 82 or 84. If connected to terminal 82 as shown in FIG. 1, secondary winding terminal 24a is thereby directly connected to the primary winding of transformer 50 and burden test circuit 64 is bypassed. In this state, burden test circuit 64 is inoperative. With swing arm 80 connected to terminal 84, burden test circuit 64 and the primary winding of transformer 50 are connected in series with secondary winding terminal 24a and watt hour meter 26, thereby rendering both burden test circuit 64 and the remaining portion of the portable tester of FIG. 1 operational.

The secondary winding of transformer 50 is coupled across resistor 52 which provides an AC signal proportional to the secondary current in transformer 16 when arm 80 of switch 48 is coupled to terminal 82. Transformer 50 may have a current ratio on the order of 10 to 1, and resistor 52 may have a resistance on the order of magnitude of 1.5 ohms. Given these specific component values, and assuming current transformer 16 has a primary to secondary ratio of 500:5, then if 1000 amperes (a rating factor of two for the 500:5 current transformer) are provided by AC source 10 through conductor 14, 10 amperes would be drawn through the primary winding of transformer 50, 1 ampere would be developed in the secondary of transformer 50, and approximately 3 volts would be developed across resistor 52.

Resistor 54 is connected in parallel with resistor 52, but preferably has a substantially greater resistance than resistor 52, for example, on the order of 10K ohms. Resistor 54 has a variable tap 88 which is connected to the input to AC to DC converter 56. AC to DC converter 56 is preferably identical to AC to DC converter 44. The output of AC to DC converter 56 is coupled to the input of DC meter 58.

DC meter 46 is a signal ratio meter. That is to say, DC meter 46 has a ratiometric feature which is determined by dividing a source voltage $V_S$ to meter 46 by a reference voltage $V_R$ where the displayed ratio is as follows:

$$(V_S/V_R) \times 10{,}000 = \text{displayed ratio.}$$

Source voltage $V_S$ is provided by the output of AC to DC converter 44. Reference voltage $V_R$ may be provided either from a reference voltage source $V_{REF}$ or from the output of AC to DC converter 56. Specifically, ratio switch 62 has a swing arm 90 which is connected to the reference voltage input to DC meter 46. Ratio switch 62 also has terminals 92 and 94, with terminal 92 connected to reference voltage $V_{REF}$ and terminal 94 connected to the output of AC to DC converter 56. If DC meter 58 is identical to DC meter 46 and, therefore, also requires a reference voltage $V_R$, that reference voltage may be supplied from reference voltage source $V_{REF}$ as shown in FIG. 1.

The position of swing arm 90 of ratio switch 62 is communicated to calibration circuit 42 as indicated by the dotted line 96 in FIG. 1. Calibration circuit 42 provides a decimal positioning signal to DC meter 46 over line 98 as will be explained in detail below.

The output of calibration circuit 42 on line 74 may be selectively connected to the input of AC to DC converter 56 by operation of polarity switch 60 as is shown in FIG. 1.

The operation of the circuit of FIG. 1 is as follows. Probe 40 is properly oriented and positioned around conductor 14 whereby an AC signal is developed over line 72 by probe 40 which is proportional to the AC signal in conductor 14. This AC signal from probe 40 is calibrated, as will be explained below, by calibration circuit 42 and delivered to AC to DC converter 44 where it is converted into a first DC voltage which in turn is applied as source voltage $V_S$ to signal ratio meter 46.

At the same time, an AC signal is developed across test resistor 52 when switch 48 has swing arm 80 connected to terminal 82. This AC signal is proportional to the magnitude of the current in the secondary of current transformer 16. A sample of the AC signal across resistor 52 is picked off from variable resistor 54 by tap 88 and delivered to AC to DC converter 56 where this AC signal is converted to a second DC signal and delivered to the source voltage $V_S$ input of DC meter 58. With the swing arm 90 of ratio switch 62 contacting terminal 92, reference voltage $V_{REF}$ is delivered as a reference voltage signal $V_R$ both to DC meter 46 and DC meter 58. In this condition, DC meter 46 displays a signal representing the primary current appearing in conductor 14 and, therefore, the current in the primary winding of current transformer 16, and DC meter 58 displays a signal representing the magnitude (preferably root mean square) of the AC signal appearing in the secondary of current transformer 16. These two displays appear simultaneously in meters 46 and 58.

To obtain a ratio display in meter 46 of the primary current to secondary current of current transformer 16, swing arm 90 of ratio switch 62 is moved from terminal 92 to terminal 94. In this position, the DC output signal from AC to DC converter 56 is used as a reference voltage $V_R$ for signal ratio meter 46. Accordingly, the display on meter 46 is indicative of the instantaneous ratio of the primary and secondary currents in current transformer 16. As will be explained below, the positioning of the decimal point in meter 46 can be critical, and this positioning may be accomplished through operation of calibration circuit 42.

The polarity connections to current transformer 16 may also be checked utilizing the circuitry of FIG. 1. Specifically, assuming that watt-hour meter 26 operates correctly when terminals 20a and 24b are connected in the respective manner shown in FIG. 1, as opposed to having terminals 20a and 20b reversely connected or terminals 24a and 24b reversely connected. To determine if this connection is properly made for current transformer 16, polarity switch 60 is closed so that the output of calibration circuit 42 is delivered to the input of AC to DC converter 56 along with the sample voltage from the secondary of current transformer 16 taken from tap 88 of variable resistor 54. If the polarity connections of current transformer 16 are correct, the AC signals delivered to converter 56 from calibration circuit 42 and resistor 54 will be in phase with one another and, therefore, add together which will cause an increase in the magnitude of the display shown on meter 58. However, if transformer 16 is connected to conductor 14 with improper polarity orientation, the AC signals from calibration circuit 42 and resistor 54 will be out of phase with one another and tend to cancel one another, causing a resultant reduction in the reading on meter 58. As a result, temporary closure of polarity switch 60 provides an accurate and quick check of the polarity connections for transformer 16.

Burden test circuit 64 is also illustrated in FIG. 1. Burden test circuit 64 comprises a rotary switch 100 having a swing arm 102 and a resistor 104 having a plurality of tap points. Burden test circuit 64 is coupled in series with swing arm 80 and terminal 82 of switch 48 so that when swing arm 80 of switch 48 is connected to the isolated terminal 84, burden test circuit 64 adds resistance from resistor 104 in series with current transformer 16 and watt-hour meter 26. By viewing meter 58 when burden test circuit 64 is introduced in series with the secondary winding of current transformer 16, the burden capacity of transformer 16 may be tested. Specifically swing arm 102 may be set to put a rated resistance in series with the secondary of current transformer 16. In this condition, swing arm 80 of switch 48 is opened to terminal 84. The reading on meter 58 should not drop significantly when this additional resistance is added to the secondary coil of transformer 16. Standard burden ratings typically require a current transformer to maintain secondary current relatively constant upon the addition of 0.1 ohms, 0.2 ohms, 0.5 ohms, 1.0 ohms, 2.0 ohms, or 4.0 ohms. Accordingly, the segments between the taps of resistor 104 are prefereably 0.1 ohms, 0.1 ohms, 0.3 ohm, 0.5 ohms, 1.0 ohms, and 2.0 ohms, respectively to achieve industry standard burden testing.

Different current probes 16 may be employed to handle a different range of primary current loads from 100 amperes to 10,000 amperes. Each of these probes preferably has approximately a 5 ampere output at full rated load, given the specific component values described herein.

Figure 2:
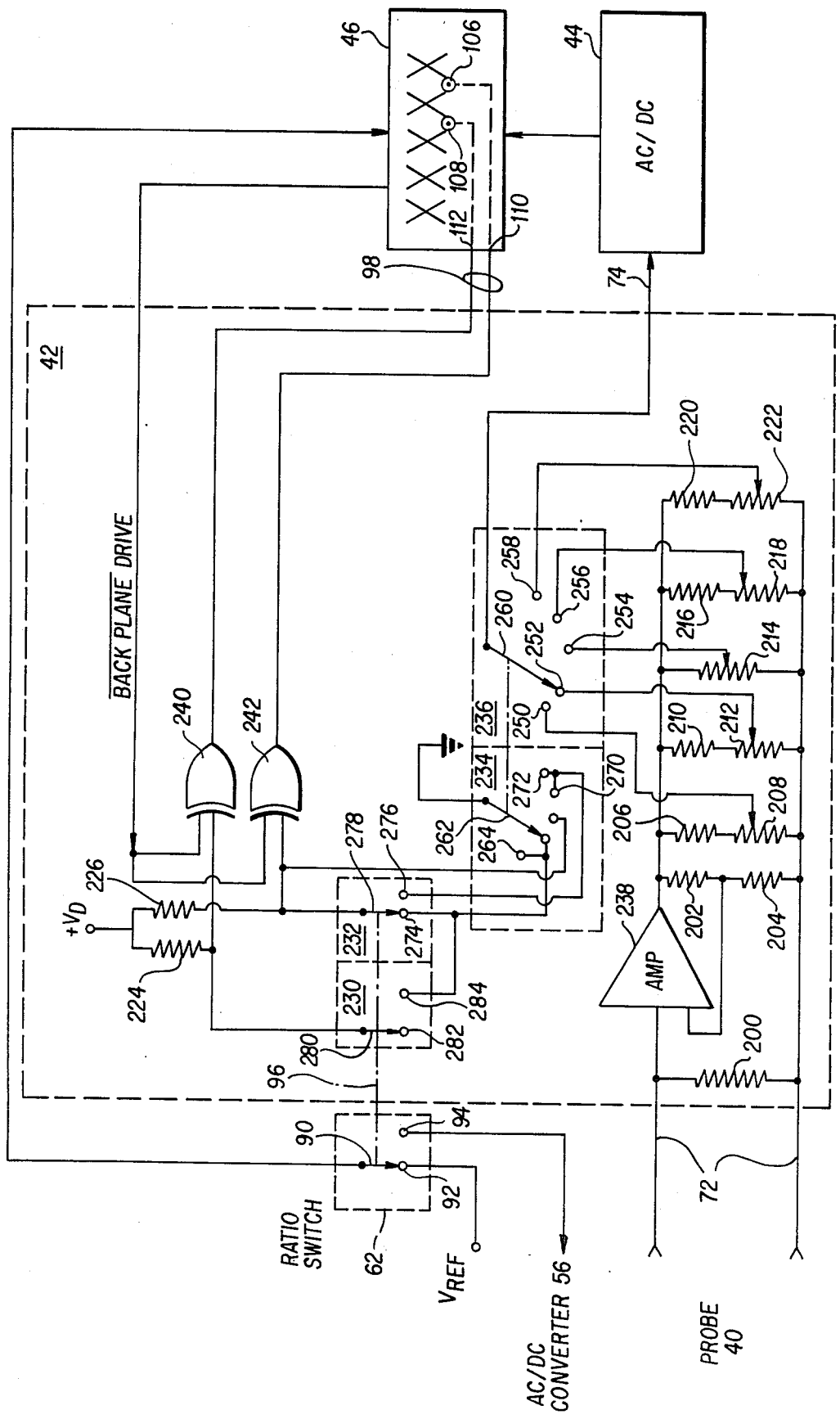
FIG. 2 is a schematic diagram of the calibration section of the tester illustrated in FIG. 1.

FIG. 2 is a schematic diagram of a preferred embodiment of calibration circuit 42. As may be seen in FIG. 2, calibration circuit 42 has as an input a signal from probe 40 and delivers as an output over line 74 a corresponding AC signal to the input of AC to DC converter 44. In addition, the position of swing arm 90 of ratio switch 62 is communicated to calibration circuit 42 as indicated by line 96. An additional decimal position output of calibration circuit 42 is shown delivered over lines 98 to DC meter 46. Specifically, DC meter 46 preferably is of a 4 and ½ digit variety which means that 5 digits are displayed, the first digit having the capacity to be either a 0 or 1 and the remaining digits having the capacity to be 0 through 9. The position of the decimal point, for example, decimal points 106 and 108, is determined by the signal delivered to decimal point input terminals 110 and 112, respectively. Thus, if a signal is delivered to decimal point input terminal 110, decimal 106 will be illuminated on the face of meter 46, whereas if a signal is delivered to decimal point input 112, decimal point 108 will be illuminated on the face of meter 46.

It is an object of calibration circuit 42 to illuminate the correct decimal point 106 or 108 or neither, when DC meter 46 is displaying either the absolute value of the primary current measured by probe 40 or the ratio of primary to secondary currents in current transformer 16.

In the embodiment of FIG. 2, calibration circuit 42 accomplishes this objective by comprising resistors 200, 202, 204, 206, 208, 210, 212, 214, 216, 218, 220, 222, 224, and 226, switches 230, 232, 234 and 236, amplifier 238, and exclusive OR gates 240 and 242. Resistor 200 is connected across input lines 72 of probe 40 to develop a signal thereacross which is proportional to the signal developed in the coil of probe 40. To develop this signal, resistor 200 may, for example, be on the order of 0.01 ohms so as to avoid any adverse loading of probe 40. Amplifier 238 is connected to resistor 220 in order to provide an amplified signal. For example, amplifier 238 may be an operational amplifier having a 50:1 gain which would provide approximately 2.5 volts at the output thereof. The series combinations of resistors 202 and 204, 206 and 208, 210 and 212, 216 and 218, and 220 and 222 are connected across the output of amplifier 238. Resistor 214 is also connected in parallel with each of these series connectors. Resistors 202, 204, 206, 208, 210, 212, 214, 216, 218, 220 and 222 may, for example, have the following values:

Resistor 202-500K ohms
Resistor 204-10K ohms
Resistor 206-300K ohms
Resistor 208-100K ohms
Resistor 210-100K ohms
Resistor 212-100K ohms
Resistor 214-100K ohms
Resistor 216-300K ohms
Resistor 218-100K ohms
Resistor 221-100K ohms
Resistor 222-100K ohms.

Resistors 208, 212, 214, 218 and 222 are all variable resistors and have their taps connected to terminals 250, 252, 254, 256, and 258 respectively, of switch 236. Switch 236 has a swing arm 260 which is connected to the input of AC to DC converter 44 by line 74. The various positions of swing arm 260 of switch 236 are chosen dependent upon the expected primary current in conductor 14. For example, terminal 250 may be selected when less than 500 amperes are expected to appear in conductor 14, terminal 252 may be selected when less than 1,000 amperes are expected to appear, terminal 254 when more than 1,000 amperes but less than 2,000 amperes are expected to appear, terminal 256 when more than 2,000 amperes but less than 5,000 amperes are expected to appear and terminal 258 when more than 5,000 amperes but less than 10,000 amperes are expected to appear in conductor 14. For each of these different ranges of expected amperes in conductor 14, a different probe 40 may be selected. For each probe and each range, the tap point on resistors 208, 212, 214, 218 and 222 are adjusted so that meter 46 displays the direct current value within each of these ranges.

The switch 234 has a swing arm 262 and a plurality of terminals 264, 266, 268, 270 and 272. Swing arm 262 is connected to ground whereas terminals 264 and 266 are connected together and, in turn, are connected to a terminal 274 of switch 232. Terminal 268 is connected directly to a first input of exclusive OR gate 242 and terminals 270 and 272 are connected together and, in turn, are connected to a terminal 276 of switch 232. Switch 232 has a swing arm 278 which is connected through resistor 226 to a positive DC voltage source $V_D$. Resistor 226 may, for example, be on the order of 100K ohms and exclusive OR gates 240 and 242 may, for example, be model No. 74C86.

Swing arms 260 and 262 of switches 236 and 234 are shown in FIG. 2 as being mechanically connected together. Obviously, if switches 234 and 236 were of an electronic variety, and not a mechanical variety as illustrated in FIG. 2, a comparable electronic interconnection would be employed. With swing arm 260 of switch 236 contacting either terminal 250 or terminal 252, swing arm 262 of switch 234 is contacting either terminal 264 or 266 which, with swing arm 278 of switch 232 contacting terminal 274, causes the second input to exclusive OR gate 242 to be driven to ground. With the other input of exclusive OR gate 242 connected to a backplane drive signal from meter 46, this condition causes a square wave to appear at the output of exclusive OR gate 242 in phase with the backplane drive. The output of exclusive OR gate 242 is coupled as shown in FIG. 2 to decimal point input terminal 110 of meter 46 and, accordingly, decimal point 106 would be illuminated. Since the expected magnitude of currents in conductor 16 would be no greater than 1,000 amperes with swing arm 260 of switch 236 coupled to either terminals 250 or 252, decimal point 106 is the correct decimal point to display under these conditions.

When the current in conductor 14 is expected to be in the range of 1,000 to 2,000 amperes, decimal point 106 is illuminated To achieve this objective, terminal 268 of switch 234 is connected directly to the first input of exclusive OR gate 242. Accordingly, when swing arm 262 is connected to terminal 268, i.e. when switch 236 is positioned in the 1,000 to 2,000 ampere range with swing arm 260 connected to terminal 254, a ground is thereby applied to the first input of exclusive OR gate 242 causing a square wave signal in phase with the backplane drive to be applied to decimal point input terminal 110 which, in turn, illuminates decimal point 106.

However, for ranges of 2,000 amperes to 10,000 amperes, no decimal point should be illuminated on meter 46. Accordingly, terminals 270 and 272 of switch 234 are connected to terminal 276 of switch 232. Therefore, when swing arm 262 is coupled to terminals 270 or 272 of switch 234 because the range of 2,000 to 10,000 amperes is expected, i.e., the swing arm of switch 236 is coupled to terminal 256 or 258, no ground signal is applied to either exclusive OR gate 240 or 242 and, therefore, neither decimal point 106 nor decimal point 108 of meter 46 is illuminated since the signals at input terminals 110 and 112 are square waves out of phase with the backplane drive.

In view of the foregoing, the calibration circuit 42 selects the correct decimal point location for meter 46 when meter 46 is utilized to measure the magnitude of the current passing through conductor 14. As will be explained below, calibration circuit 42 also correctly positions the decimal point of meter 46 when meter 46 is utilized to display the ratio of primary to secondary currents in current transformer 16.

To achieve this objective, swing arm 280 of switch 230 and swing arm 278 of switch 232 are connected together and to swing arm 90 of ratio switch 62 as indicated by interconnection 96. Switch 230 has a first terminal 282 and a second terminal 284. First terminal 282 of switch 230 is isolated and terminal 284 of switch 230 is connected to terminals 264 and 266 of switch 234. Swing arm 280 of switch 230 is connected to positive voltage $V_D$ through resistor 224 which, like resistor 226, may be on the order of 100K ohms. The junction of resistor 224 and swing arm 280 is connected to a first input of exclusive OR gate 240 while a second input of exclusive OR gate 240 is directly connected to positive source $V_D$.

These interconnections are based upon the assumption that a standard commercially available current transformer 16 is being measured. Given this assumption, if current transformer 16 is capable of accepting a primary current of between 200 to 400 amperes, the ratio of current transformer 16 is expected to lie within the range of 200:5 to 400:5. If current transformer 16 is capable of accepting primary currents in the range of 400 to 800 amperes, the ratio of primary to secondary windings in current transformer 16 are expected to fall within the range of 400:5 to 800:5. Likewise, if current transformer 16 is capable of accepting primary currents in the range of 800 to 2,000 amperes, the primary to secondary current ratio of current transformer 16 is expected to lie in the range of 1,200:5 to 2,000:5, and if current transformer 16 is capable of accepting primary current in the range of 2,000 to 12,000 amperes, the primary to secondary current ratio of transformer 16 is expected to fall in the range of 2,000:5 to 12,000:5.

Given these assumptions, the connections set forth in FIG. 2 for switches 230, 232, 234 and 236 provide the correct decimal illumination when meter 46 is used to display either the primary current in transformer 16 or the ratio of primary to secondary currents through operation of ratio switch 62. Specifically, with switch 234 set in the 200 to 1,000 ampere range, i.e., with swing arm 262 connected to either terminal 264 or 266 and when ratio switch 62 is not activated causing swing arm 278 of switch 232 to connect to terminal 274, the first input of exclusive OR gate 242 is connected to ground through swing arm 278, terminal 274, terminal 264 or 266, and swing arm 262. Accordingly, decimal point 65 106 is illuminated. Specifically, with less than 1,000 amperes (but more than 100 amperes) flowing through the primary current transformer 16, the second, third, fourth and fifth digits (0XXXX) of meter 46 will be illuminated and decimal point 106 needs to be illuminated in order to present a signal ranging between 1 and 999 (0XXX.X). However, if ratio switch 62 is activated and swing arm 262 of switch 234 is connected to terminals 264 or 266, decimal 108 is illuminated by having the first input of exclusive OR gate 240 connected to ground through swing arm 280, terminal 284, terminal 264 or 266, and swing arm 262. This is correct since the range of primary to secondary current ratio for commercially available current transformers capable of withstanding primary currents of 800 amps or less is, as was mentioned above, in the range of 200:5 to 800:5 or in other words, in the range of 40:1 to 160:1. To display a number between 40 and 160 on meter 46, decimal point 108 needs to be illuminated.

In a similar manner, the connections of FIG. 2 automatically provide for correct decimal placement regardless of the range of the primary current delivered to current transformer 16.

Obviously, different connections may be required in order to achieve this objective of the proper decimal point placement if different primary to secondary current ratio ranges are anticipated. Accordingly, departures may be made from the specific details of the embodiment disclosed in FIG. 2 consistent with the general teachings which have been presented herein.

In this regard, additional advantages and modifications will readily occur to those skilled in the art, having received the benefit of the foregoing description. The invention in its broader aspects is, therefore, not limited to the specific details, representative apparatus, and illustrative examples shown and described. Accordingly, departures may be made from such details without departing from the spirit or scope of applicants' general inventive concept.

We claim:

1. A portable tester for determining the primary winding to secondary winding current ratio of a current transformer for a watt-hour meter while said transformer is in service with said primary winding coupled to an active power line carrying a first AC signal and with said secondary winding coupled to said watt-hour meter to deliver a second AC signal to said watt-hour meter, said tester comprising:
    a. a current probe having a split core positionable around said active power line to provide a third AC signal which is proportional in magnitude to the magnitude of said first AC signal;
    b. means for deriving a first DC signal having a magnitude proportional to the magnitude of said third AC signal;
    c. means for deriving a second DC signal, having a mangitude proportional to the magnitude of said second AC signal; and
    d. means for converting said first and second DC signals into a display of the ratio of said first and second DC signals, said converting means including a DC signal ratio meter and means for simultaneously applying said first and second DC signals to said signal ratio meter to display said ratio on said signal ratio meter.

2. The tester of claim 1 including:
    a. means for supplying a reference signal; and wherein
    b. said means for simultaneously applying includes means for selectively displaying on said signal ratio meter either said ratio of said first and second DC signals or the magnitude of said first DC signal, said means for simultaneously applying comprising a ratio switch which selectively couples either said reference voltage or said second DC voltage as one input to said signal ratio meter, the other input being said first DC voltage.

3. The tester of claim 2 including:
a. a third meter; and
b. means for applying said second DC signal to said third meter.

4. The tester of claim 1, 2 or 3 further including:
a. means for orienting said current probe relative to the source of said first AC signal; and
b. means for determining, upon proper orientation of said probe, whether said current transformer is connected to said power line and said watt-hour meter with correct polarity, said means for determining including a polarity switch connected to selectively deliver said third AC signal to the input of said means for deriving a second DC signal.

5. The tester of claim 1, 2 or 3 further including means for selectively placing a variable resistance in series with said watt-hour meter.

6. The tester of claim 4 further including means for selectively placing a variable resistance in series with said watt-hour meter.

7. A portable tester for determining the primary winding to secondary winding current ratio of a curent transformer for a watt-hour meter while said transformer is in service with said primary winding coupled to an active power line carrying a first AC signal and with said secondary winding coupled to said watt-hour meter to deliver a second AC signal to said watt-hour meter, said tester comprising:
a. a current probe having a split core positionable around said active power line to provide a third AC signal which is proportional in magnitude to the magnitude of said first AC signal;
b. means for deriving first DC signal having a magnitude proportional to the magnitude of said third AC signal;
c. means for deriving a second DC signal having a magnitude proportional to the magnitude of said second AC signal;
d. a signal ratio meter having first and second ratio signal inputs and having at least one decimal point signal input with the signal at said decimal point signal input determining the location of a decimal point in said signal ratio meter;
e. means for coupling said first DC signal to said first ratio signal input of said signal ratio meter;
f. a reference voltage source;
g. a ratio switch connected to selectively couple either said reference voltage or said second DC voltage to said second ratio signal input of said signal ratio meter; and
h. means for providing a decimal point signal to said decimal point signal input of said signal ration meter.

8. The tester of claim 7 wherein said means for providing a decimal point signal is responsive to the range of said first AC signal.

9. The tester of claim 7 wherein said means for providing a decimal point signal is responsive to said ratio switch.

10. The tester of claim 8 wherein said means for providing a decimal point signal is also responsive to said ratio switch.

11. A method for field testing the primary to secondary current ratio of a current transformer for a watt-hour meter while the current transformer is operated under actual load conditions, comprising the steps of:
a. positioning a current probe having split core around a conductor carrying primary current to said current transformer, without disconnection of said conductor from said current transformer, to obtain a first AC signal from said current probe which is proportional to said primary current;
b. converting said first AC signal to a first DC signal;
c. inserting a test load in series with the normal watt-hour meter connected to secondary of said current transformer to develop a second AC signal across said test load which is proportional to said secondary current;
d. converting said second AC signal to a second DC signal; and
e. simultaneously applying said first and second DC signals to a signal ratio meter to display the resultant simultaneous ratio of said first and second DC signals while said current transformer is operated under actual load conditions.

12. A method of claim 11 further including the step of:
f. varying said test load to observe any corresponding variation of said resultant ratio.

* * * * *